United States Patent [19]
Harvey

[11] Patent Number: 5,760,587
[45] Date of Patent: Jun. 2, 1998

[54] BATTERY MEASUREMENT METHOD

[75] Inventor: Thomas Patrick Harvey, Novi, Mich.

[73] Assignee: Ford Global Technologies, Inc., Dearborn, Mich.

[21] Appl. No.: 496,637

[22] Filed: Jun. 28, 1995

[51] Int. Cl.$^6$ .................................................. G01N 27/416
[52] U.S. Cl. .............................. 324/434; 320/18; 320/48; 324/426; 340/636
[58] Field of Search ......................... 324/434, 426; 318/139; 320/48, 15

[56] References Cited

U.S. PATENT DOCUMENTS

| | | | |
|---|---|---|---|
| 4,484,140 | 11/1984 | Dieu | 324/434 |
| 4,709,202 | 11/1987 | Koenck et al. | 320/43 |
| 5,107,191 | 4/1992 | Lowndes et al. | 318/139 |
| 5,206,578 | 4/1993 | Nor | 320/18 |
| 5,237,257 | 8/1993 | Johnson et al. | 320/106 |
| 5,302,902 | 4/1994 | Groehl | 324/434 |
| 5,315,533 | 5/1994 | Stick et al. | 364/480 |
| 5,350,995 | 9/1994 | Iketani | 320/15 |
| 5,365,160 | 11/1994 | Leppo et al. | 320/22 |

OTHER PUBLICATIONS

Mirabor Designs "Modular Battery Charging System".
Delco Remy/AutoEnvironment "SmartGuard".

*Primary Examiner*—Ernest F. Karlsen
*Assistant Examiner*—Thomas Valone
*Attorney, Agent, or Firm*—Mark S. Sparschu

[57] ABSTRACT

The present invention provides a method for detecting an electrical conductivity leakage path in a vehicle having a plurality of batteries coupled in series and having a chassis ground. The method comprises the step of (a) providing a voltage divider for each of the batteries, each voltage divider having an output having a voltage at a potential between the potentials of the positive and negative terminals of the voltage divider's respective battery. The method also includes the step of (b) providing a plurality of electrical connections, each switchable between open and closed, each between a voltage divider output and chassis ground. Furthermore, the method comprises the steps of (c) closing the switchable electrical connection between the first voltage divider output and chassis ground. In addition, the method includes the steps of (d) measuring the voltage at the first voltage divider output with the switchable electrical connection between that voltage divider output and chassis ground closed; and (e) opening the switchable electrical connection between the first voltage divider output and chassis ground.

6 Claims, 3 Drawing Sheets

BATTERY MEASUREMENT METHOD

BACKGROUND OF THE INVENTION

1. Field of the Invention

The present invention relates to measurement systems for batteries

2. Description of the Related Art

In the operation of an electrically-powered vehicle, it is desirable to monitor the individual voltages of the batteries which in combination provide power for propulsion of the vehicle. By monitoring these voltages, a battery which is nearing the end of its useful life can be identified and replaced prior to failure. Also, by monitoring the state of charge of the batteries while the batteries are charging at a charging station, an ideal charging of the batteries can be accomplished.

Although several systems for measuring battery voltage are known, a particularly high-resolution comparison of battery voltage with a voltage threshold can be valuable, especially when monitoring some battery technologies.

Another desirable function related to the batteries of an electric vehicle is detecting when an electrical conductivity leakage path exists between any of the batteries and the chassis ground of the vehicle. Typically, the batteries of an electric vehicle are isolated by design from the chassis ground of the vehicle. However, due to leakage of electrolyte from a cracked battery case or through battery vents, or due to other factors, an electrical conductivity leakage path can be formed between a battery and chassis ground. It is desirable to detect such a path and replace the battery responsible for the conductivity leakage path Therefore, a battery measurement system which provides effective electrical conductivity leakage detection will provide an advantage over known battery measurement systems. Likewise, a battery measurement system which provides a high-resolution comparison of battery voltage with a voltage threshold will provide an advantage over known systems.

SUMMARY OF THE INVENTION

The present invention provides a method for detecting an electrical conductivity leakage path in a vehicle having a plurality of batteries coupled in series and having a chassis ground. The method comprises the step of (a) providing a voltage divider for each of the batteries, each voltage divider having an output having a voltage at a potential between the potentials of the positive and negative terminals of the voltage divider's respective battery. The method also includes the step of (b) providing a plurality of electrical connections, each switchable between open and closed, each between a voltage divider output and chassis ground Also, the method comprises the steps of (c) closing the switchable electrical connection between the first voltage divider output and chassis ground. In addition, the method includes the steps of (d) measuring the voltage at the first voltage divider output with the switchable electrical connection between that voltage divider output and chassis ground closed; and (e) opening the switchable electrical connection between the first voltage divider output and chassis ground.

This invention provides effective electrical conductivity leakage detection and identification of the location of the leakage. The invention further provides a high-resolution comparison of battery voltage with a voltage threshold. Thus, the present invention provides advantages over known battery measurement systems.

DETAILED DESCRIPTION OF THE PREFERRED EMBODIMENT

Figure 1:
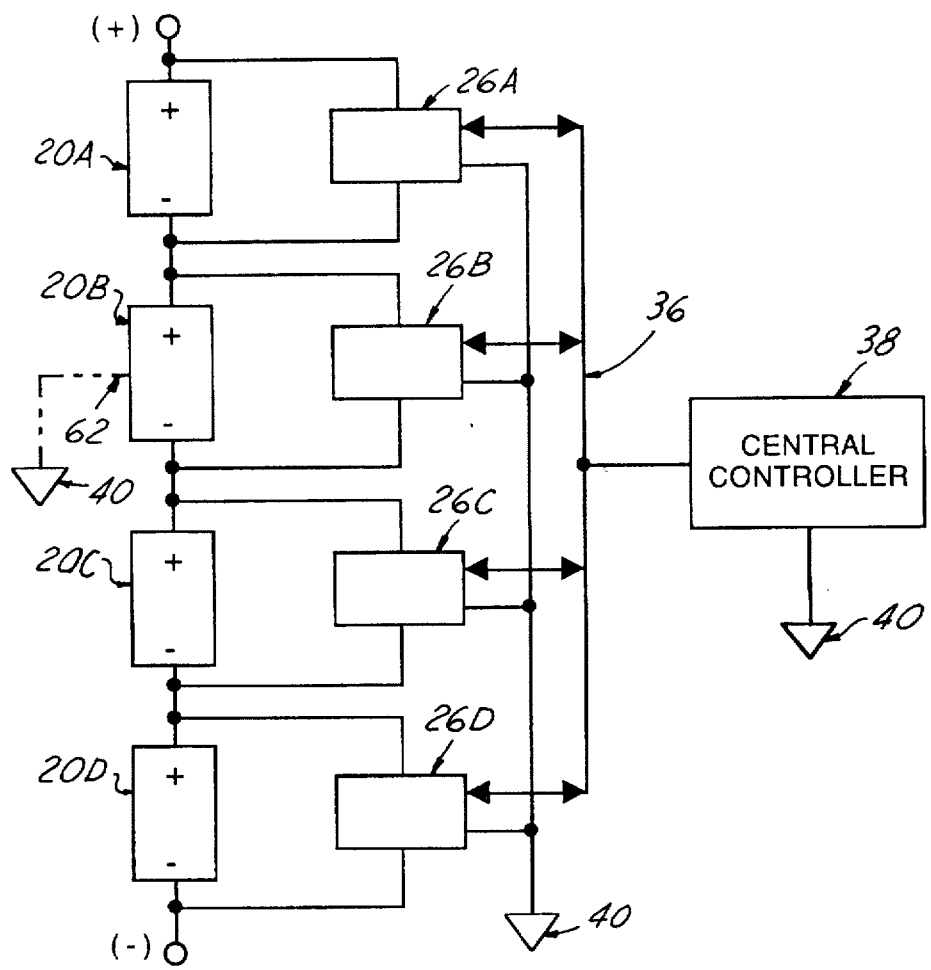
FIG. 1 is a block diagram of a battery measurement system according to one embodiment of the present invention.

Referring to FIG. 1; a battery measurement system according to one embodiment of the present invention will be discussed. In this embodiment of the present invention, batteries 20A–20D are "traction batteries" of an electric vehicle. "Traction batteries" are so named because they provide power for the propulsion of the vehicle. In FIG. 1, four traction batteries are shown, but in reality the number can vary widely based on requirements of the vehicle and on the particular battery technology being used. In one proposed configuration, 28 lead-acid batteries, each having a potential of 12 volts, are used.

Batteries 20A–20D are connected in series. The series connection has a positive terminal (+) and a negative terminal (−) from which power for the propulsion of the vehicle is extracted from batteries 20A–20D. With 28 12-volt lead acid batteries, the nominal voltage between the (+) and (−) terminals of the series connection of traction batteries is thus 336 volts.

Battery measurement modules 26A–26D are each connected across one of batteries 20A–20D. (From this point forward, batteries 20A–20D will each be referred to as a "battery 20" or will be referred to collectively as "batteries 20", except when it is necessary to refer to a particular battery such as "battery 20B". This convention will likewise be followed with battery measurement modules 26A–26D.) Battery measurement modules 26 are communicatively coupled to one another by a digital data communication bus 36. Data communication bus 36 can be a Class B (medium-speed) serial bus operating under the Society of Automotive Engineers (SAE) Recommended Practice J1850. In the preferred embodiment of the present invention, a central controller 38 is also communicatively coupled to data communication bus 36. Central controller 38 contains a microprocessor or microprocontroller and can be a standalone controller responsible for monitoring the conditions of batteries 20. Central controller 38 can also be integrated as a part of another controller on the electric vehicle (such as the controller for the electric motor(s) which propel the electric vehicle). The functions ascribed herein to central controller 38 can further be included in one of the battery measurement modules 26.

Each of battery measurement modules 26 also has a connection to chassis ground 40 of the electric vehicle. By design of the electric vehicle, chassis ground 40 is electrically isolated from batteries 20.

Figures 4, 5:
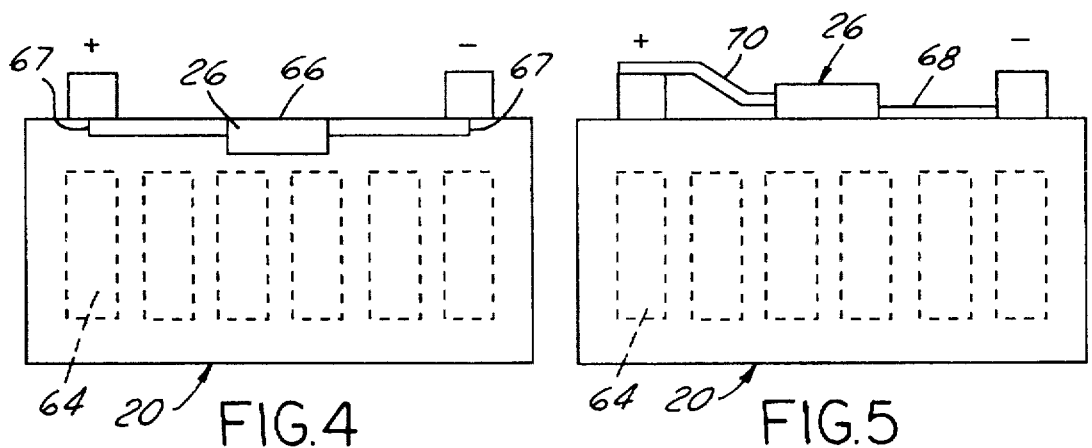
FIG. 4 is a plan view of a battery 20, showing a mounting design for a battery measurement module 26.
FIG. 5 shows an alternative mounting design for a battery measurement module 26.

Examples of how battery measurement modules 26 can be mounted to or mounted within batteries 20 are illustrated in FIGS. 4 and 5. Referring first to FIG. 4, battery 20 includes a number of internal cells 64. The number of cells 64 depends upon the battery technology used and design considerations of the electrical system of the electrical vehicle. Six cells 64 are illustrated in FIG. 4, this being the number of cells in each battery 20 if batteries 20 are 12-volt lead-acid batteries.

Battery measurement module 26 is molded into the case of battery 20. Connections to the positive and negative terminals of battery 20 are accomplished with internal wires 67 or other conductors. Other connections to battery measurement module 26 can be accomplished by a header connector molded into surface 66 at the top of battery 20, or through one or more pigtails extending through surface 66.

Referring now to FIG. 5, battery measurement module 26 can also be incorporated into its own housing, preferably plastic, and mounted onto the top of battery 20. Connection to the negative terminal of battery 20 can be via a wire 68. Connection to the positive terminal of battery 20 can be via a thick copper bus bar 70. Thick bus bar 70 will be highly thermally conductive. A thermistor within battery measurement module 26 can be in thermal contact with this bus bar 70. Thus, a thermal path from the thermistor to the inside of battery 20 is established through bus bar 70 and the positive terminal of battery 20. Therefore, battery measurement module 26 can measure the internal temperature of battery 20. Other electrical connections to battery measurement module 20 can be via a connector molded into the housing of battery measurement module 26 or via a pigtail extending from inside battery measurement module 26 through its housing. If measurement of the internal temperature of battery 20 is not desired, bus bar 70 can be replaced by a simple wire. Likewise, if measurement of the internal temperature of battery 20 is to be accomplished with a thermistor or other temperature sensing device located within battery 20 and wired to battery measurement module 26, the high thermal conductivity of bus bar 70 will not be required. A simple wire can be used instead.

It will be appreciated from this discussion that each battery measurement module 26 is preferably mounted in proximity to its respective battery 20. In "proximity" can include within the respective battery 20, on the respective battery 20, or close to the respective battery 20.

Figure 2:
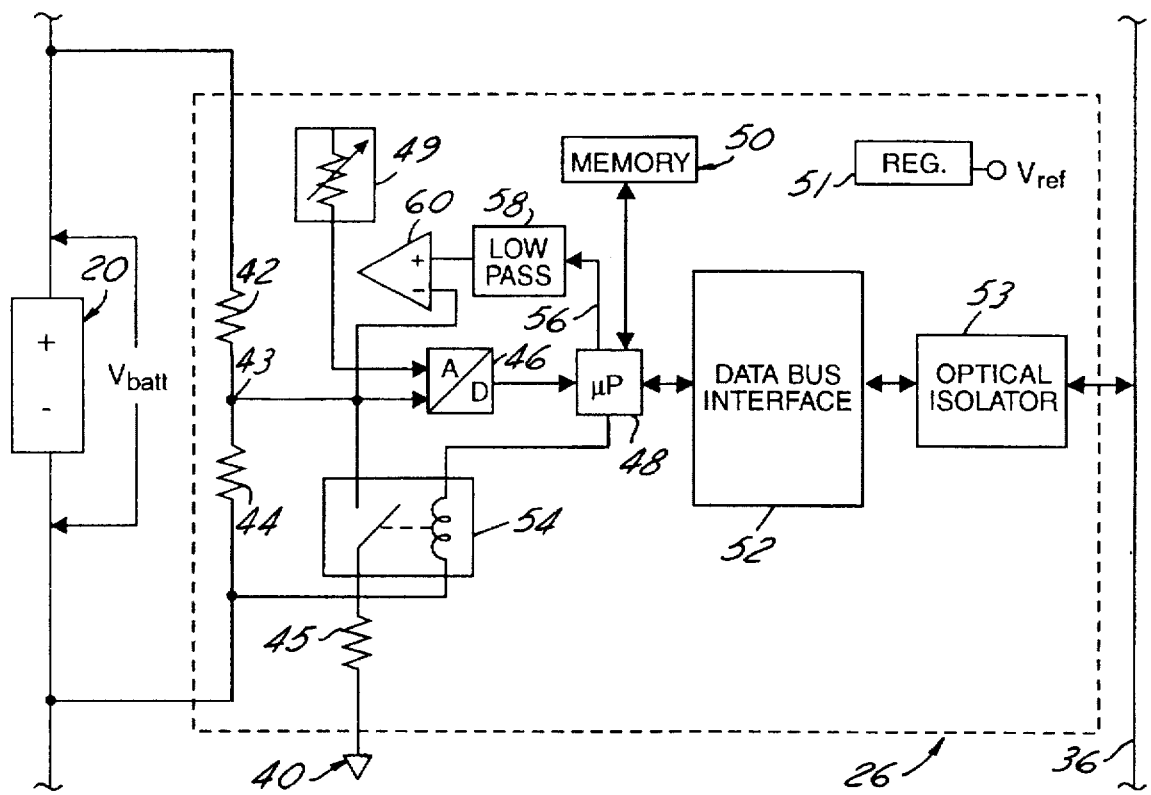
FIG. 2 is a block diagram of a battery measurement module 26 of FIG. 1.

The internal circuitry within battery measurement modules 26 will be described with further reference to FIG. 2. Preferably, battery measurement modules 26 are identical thereby providing substantial cost advantages through economies of scale. Modules 26 each comprise a voltage divider comprising resistors 42 and 44 with the center (output) node 43 of that voltage divider connected to an analog-to-digital (A/D) converter 46. Resistors 42 and 44 are chosen such that the voltage $V_{batt}$ across battery 20 is scaled down to a voltage within the range readable by A/D converter 46. (The scale factor of the voltage divider will periodically be referred to as "k". "k" being a constant less than one.) In the interest of keeping the cost of modules 26 low, A/D converter 46 is preferably an eight-bit device. The output of A/D converter 46 is fed to microprocessor 48. Microprocessor 48 is coupled to sufficient memory 50 in order for microprocessor 48 to perform the functions ascribed to it herein. Memory 50 can include electrically-erasable read-only memory (EEPROM) if non-volatile storage of information is desired.

A number of variations of partitioning of A/D converter 46, microprocessor 48 and memory 50 are possible. All of these components can be standalone, as shown in FIG. 2. Alternatively, all of these components can be included in a "single-chip" microcontroller. An example of such a single-chip microcontroller is model number PIC16C71 from Microchip Corporation. Other partitioning can also be done, given the wide variety of microprocessors and microcontrollers on the market.

A voltage regulator 51 provides an internal regulated voltage $V_{ref}$ for the operation of battery measurement module 26, including providing power for microprocessor 48 and a reference for A/D converter 46. As its power source, voltage regulator 51 is connected across battery 20, the connection not shown in FIG. 2 for simplicity.

Microprocessor 48 is coupled to data bus 38 via a data bus interface 52 and an optical isolator 53. Data bus interface 52 is an interface appropriate for the data bus 36 being utilized. As has been mentioned, data bus 36 can be a bus conforming to SAE Recommended Practice J1850. An advantage of using such a data bus 36 is the ready availability of a number of data bus interfaces 52. Optical isolator 53 optically isolates the components within battery measurement module 26 from data bus 36, to prevent large common mode voltages between battery measurement modules 26. A number of optical isolators are available on the market.

Microprocessor 48 controls a relay 54. When the coil of relay 54 is energized and the relay contact closes, electrical connection is made between node 43 and chassis ground 40 via a resistor 45. The only connection of battery measurement module to chassis ground is via relay 54 and resistor 45. Resistor 45 is preferably large, so as to not significantly degrade the isolation of battery measurement module 26 from chassis ground 40 when relay 54 is closed.

Relay 54 can be replaced by a solid state switch such as a field-effect transistor (FET). Here, the microprocessor 48 would drive the gate of the FET via an optically-coupled interface, to prevent large common mode voltages between battery measurement modules 26 via chassis ground 40. Such an optically-coupled "relay" is available, for example, as model number LCA110 from CP Clare Corporation.

A further output of microprocessor 48 is PWM circuit 56. Such a PWM output is a common feature of many microprocessors and microcontrollers. This PWM circuit 56 is preferably controllable through a range of duty cycles, the duty cycles selectable with 12-bit resolution. A low-pass filter 58 with a bandwidth much lower than the frequency of the PWM signal is coupled to PTM circuit 56 to extract the average (DC) value of the PWM signal. The output of low-pass filter 58 is input into the non-inverting input of a comparator 60. The inverting input of comparator 60 is coupled to node 43. The output of comparator 60 is routed to an input of microprocessor 48, this connection not shown in FIG. 1.

It will be apparent to one skilled in the art that one considerable advantage in the design of the battery measurement system disclosed herein is that battery measurement modules 26 are not exposed to large common mode voltages. Each module 26 is in fact exposed only to the voltage across its respective battery 20. Thus, measurement problems associated with large common mode voltages are not an issue in this system. Further, expensive components which can withstand high common-mode voltages are not needed.

A further advantage of this system is that long wire runs from batteries 20 to battery measurement modules 26 are not used. The tendency for long, high-impedance wire runs to be corrupted by electromagnetic noise is thus not present in this system. The only long wire runs in the system are associated with data bus 36, which is not noise-susceptible.

The operation of battery measurement modules 26 will now be discussed. With relay 54 open (such that the electrical connection between node 43 and chassis ground 40 is not made and the voltage divider comprising output node 43 is thus in a "no-load" condition), A/D converter 46 measures the voltage at node 43. Since resistors 42 and 44 are preferably of equal resistance, A/D converter 46 will measure one half of the voltage $V_{batt}$ across the battery 20 to which battery measurement module 26 is coupled. A/D converter 46 passes this measurement in eight-bit digital form to microprocessor 48.

Microprocessor 48 can do a number of things with this measured voltage Microprocessor 48 can pass the voltage measurement via data bus 36 to central controller 38, which can proceed to do calculations with the data (such as, for example, calculating the state of charge of battery 20 or monitoring the number and/or depth of charge/discharge cycles undergone by battery 20). Alternatively, microprocessor 48 can itself do such calculations and pass the results, rather than the raw voltage data, to central controller 38.

Microprocessor 48 can take the voltage measurements on its own initiative. However, a particularly powerful capability of this embodiment of the present invention is for central controller 38 to send a "global" request on data bus 36 for all battery measurement modules 26 to take their measurements at the same time. In this way, a simultaneous indication of the state of charge of batteries 20 can be obtained. The raw voltage data (or computed state of charge) obtained by battery measurement modules 26 can then be returned to central controller 38. One skilled in the art of battery control for electric vehicles will appreciate the advantage of having simultaneously-measured voltage and/ or state of charge information about batteries 20. For instance, simultaneously knowing the voltages of all batteries 20 can help identify any batteries 20 whose internal impedances are creeping upward over time. Such batteries 20 will have voltages below the voltages of the other batteries 20.

For most purposes, the voltage so measured by A/D converter 46 is of sufficient resolution for the purpose of monitoring batteries 20. However, for some conditions and with some battery technologies, a higher resolution indication regarding when the voltage of the battery crosses a particular threshold is desirable.

Comparator 60 provides this indication. As has been mentioned, microprocessor 48 generates a PWM signal with 12-bit resolution on circuit 56. The average value of this signal is extracted with low-pass filter 58 and is then compared to the voltage at node 43. Thus, the voltage of battery 20 can be compared to a threshold with higher resolution (i.e., 12 bits) than the resolution used for voltage measurement by A/D converter 46 (i.e. eight bits). The output of comparator 60 can be fed to an input of microprocessor 48 (the connection not shown in FIG. 2), SO that microprocessor 48 can detect when the voltage threshold has been crossed. Microprocessor 48 can pass this information, or calculations based on this information, to central controller 38 via data bus 36.

Within each battery measurement module 26, a thermistor 49 is also provided. This thermistor 49 is provided to measure the internal temperature of the battery 20 to whose terminals battery measurement module 26 is coupled. If battery measurement module 26 is mounted within battery 20 (as shown in FIG. 4 and discussed above), thermistor 49 will measure the internal temperature of battery 20 just by virtue of being located within battery measurement module 26. If, however, battery measurement module 26 is located outside battery 20 and coupled to a terminal of battery 20 via a bus bar 70 (FIG. 5), thermistor 49 can be thermally mounted to the bus bar 70 inside battery measurement module 26.

Thermistor 49 is preferably connected in series with a fixed resistor within battery measurement module 26. This series connection is connected to a regulated five-volt voltage source (not shown) within battery measurement module 26. Thermistor 49 and the fixed resistor form a voltage divider, the output of which is fed to A/D converter 46.

As an alternative to measuring temperature with a voltage divider comprising thermistor 49, a zener-type temperature sensing device can be provided. Such a outputs a voltage which is a function of the device's temperature. One such device is marketed by National Semiconductor Corporation under model number LM35. Other conventional temperature sensing devices can be used as well.

As with voltage data measured by battery measurement modules 26, the temperature data can be passed via data bus 36 to central controller 38. Alternatively, the temperature data can be used for calculations within battery measurement modules 26, with results of those calculations passed via data bus 36 to central controller 38. One such calculation which can use temperature data is state of charge. The threshold beyond which batteries 20 should not be charged or discharged is frequently also a function of battery temperature.

Battery measurement modules 26 also facilitate the detection of an electrical conductivity leakage path between any of batteries 20 and ground. Such a conductivity leakage path is shown in phantom as conductivity leakage path 62 in FIG. 1. As has been mentioned, batteries 20 are all electrically isolated by design from chassis ground 40. However, due to a number of factors such as leakage of electrolyte from a battery 20, an electrical conductivity leakage path can be established between a battery 20 and chassis ground 40. Such a conductivity leakage path will have a resistance lower than the extremely high resistance intended to isolate batteries 20 from chassis ground 40.

Such a conductivity leakage path 62 can be detected as follows. In one battery measurement module 26, microprocessor 48 closes relay 54. Electrical connection between node 43 and chassis ground 40 is thus established via resistor 45 If no electrical conductivity leakage path 62 exists at any of batteries 20, no current will flow through resistor 45 when relay 54 is closed However, if an electrical conductivity leakage path 62 exists current will flow through resistor 45. This current will cause the voltage measured by A/D converter 46 to change. Whether the voltage measured by A/D converter 46 rises or falls in response to the current flowing through resistor 45 depends upon where conductivity leakage path 62 is located relative to the battery 20 to which the battery measurement module 26 is connected. If the conductivity leakage path 62 is as shown (at battery 20B), and if the battery measurement module presently testing for leakage is battery measurement module 26A, the voltage measured by A/D converter 46 in module 26A will drop in response to current through resistor 45. This drop will occur because battery measurement module 26A is at a higher potential than battery 20B and will therefore source current through resistor 45 and conductivity leakage path 62 to battery 20B.

If on the other hand, the battery measurement module presently testing for leakage is battery measurement module 26C or 26D, still assuming conductivity leakage path 62 is located at battery 20B, the voltage at A/D converter 46 will rise when relay 54 is closed. This result is due to battery 20B sourcing current via conductivity leakage path 62 and resistor 45 to battery measurement module 26C or 26D.

Finally, if the battery measurement module 26 presently testing for leakage is battery measurement module 26B, the voltage at A/D converter 46 will change only a relatively small amount (if at all) when relay 54 is closed.

Figure 3:
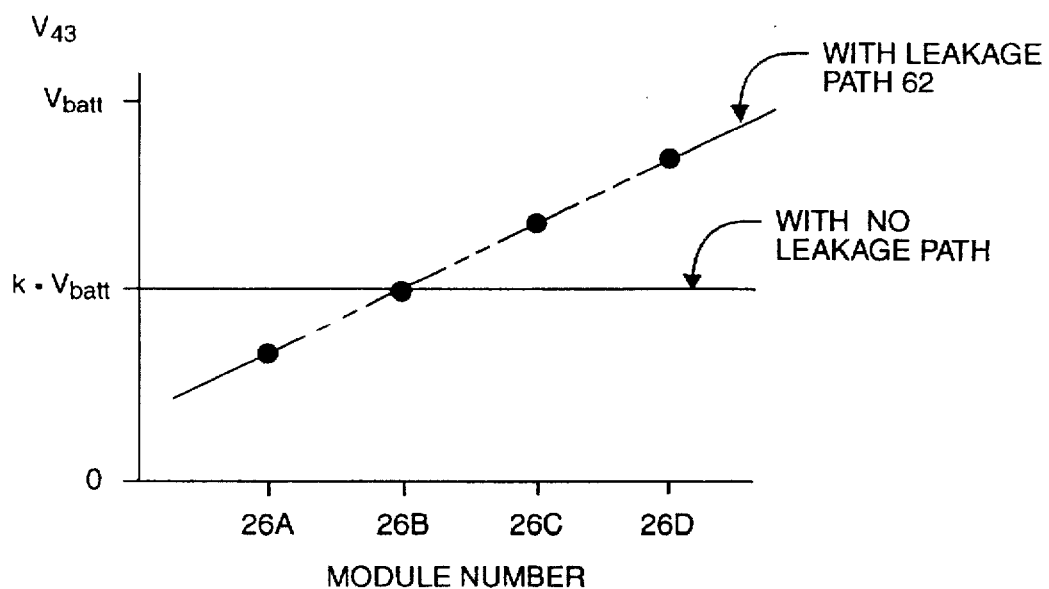
FIG. 3 is a graph showing voltage measurements taken by battery measurement modules 26 while performing a test for an electrical conductivity leakage path from batteries 20.

In testing for a conductivity leakage path such as conductivity leakage path 62, battery measurement modules 26 one at a time close their relays 54, take a voltage measurement at node 43, and then open their relays 54. The resulting voltage measurements are shown graphically in FIG. 3. With no conductivity leakage path, no current will flow through resistors 45 when any of relays 54 are closed. Thus, the voltage at each node 43 ("$V_{43}$") of the battery measurement modules 26 will be $k \cdot V_{batt}$ (the no-load" voltage at node 43), not changing when any of relays 54 close. However, with a conductivity leakage path, such as conductivity leakage path 62 at battery 20B, the voltage measurements at node 43 of the battery measurement modules 26 will vary as has been discussed. That is, for battery measurement modules such as battery measurement module 26A, which are coupled to a battery of higher potential than the battery with the leakage, $V_{43}$ will drop below $k \cdot V_{batt}$. For battery measurement modules such as battery measurement module 26C and 26D, which are coupled to a battery 20 of lower potential than the battery with the leakage, $V_{43}$ will rise above $k \cdot V_{batt}$. Further, $V_{43}$ of module 26D, which is of lesser potential than module 26C, will rise more above $k \cdot V_{batt}$ than $V_{43}$ of module 26C. For module 26B, which is coupled to the battery 20 having the conductivity leakage path, $V_{43}$ will remain the nearest to $k \cdot V_{batt}$ of any module 26.

Thus, by sequentially closing the relays 54 of battery measurement modules 26 and measuring the resultant voltages at node 43 of battery measurement modules 26, the following information can be determined. First, if any of the voltages at nodes 43 vary from $k \cdot V_{batt}$, a conductivity leakage path has been detected. The appropriate action can then be taken. This action can include indicating the existence of the conductivity leakage path to the vehicle's driver via a warning lamp and/or storing a diagnostic code in memory within central controller 38. The action can also include disconnecting batteries 20 from the rest of the vehicle via relays (not shown) which connect the (+) and (−) terminals of the series connection of batteries 20 to the rest of the vehicle. Second by determining which voltage at node 43 is closest to its respective $k \cdot V_{batt}$, the battery 20 containing the leakage is identified. By so identifying the battery 20 with the conductivity leakage path, servicing of the electric vehicle is greatly facilitated. The faulty battery 20 can be removed and replaced in a very short period of time, without a trial-and-error effort to find the faulty battery.

One point should be noted here. In order to make the comparison of a voltage at node 43 with relay 54 closed and the "no-load" voltage at that node 43, these voltages being compared are preferably measured in quick succession. This is true because the respective $V_{batt}$'s of batteries 20 are subject to rapid changes during the operation of the vehicle. Thus, the comparison between the "no-load" voltage of a particular voltage divider and the voltage of that voltage divider with relay 54 closed is of the most value when those voltages are measured near in time to one another.

Figure 6:
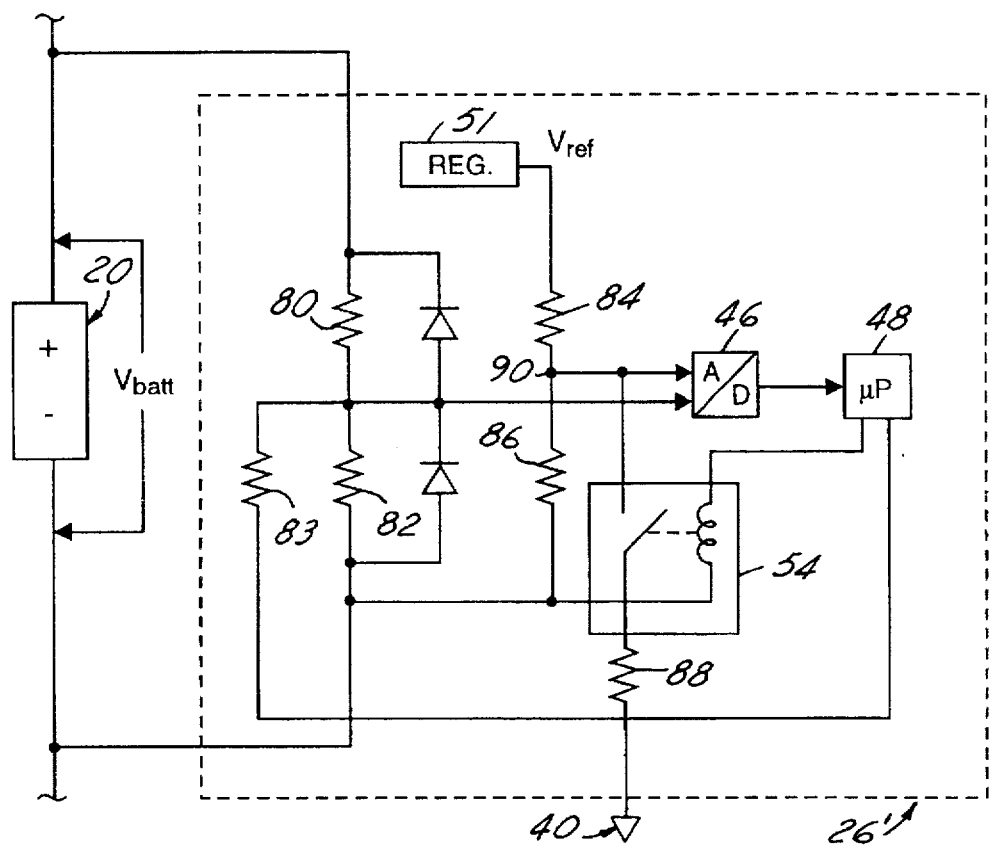
FIG. 6 shows a design for an alternative battery measurement module 26'.

An alternative configuration of battery measurement module 26 is shown as reference number 26' in FIG. 6. Here, a voltage divider comprising resistors 80 and 82 is used for the voltage measurement function (as opposed to conductivity leakage detection function) previously described. Resistor 83 can optionally be added to the voltage divider by microprocessor 48, if it is desirable for the scaling provided by the voltage divider to be changed under different conditions. Resistor 83 is coupled to an open-collector output of microprocessor 48. When that open-collector output is OFF, resistor 83 is not incorporated into the voltage divider. When the open-collector output is ON, the lower side of resistor 83 is pulled to near ground, essentially putting resistor 83 in parallel with resistor 82 and changing the scaling provided by the voltage divider. Such an ability to change the scaling provided by the voltage divider can be of advantage if it is desired to use the same battery measurement module 26' in several different vehicles using different battery technologies. Very high volumes of the same battery measurement module 26' can be produced, with the proper voltage divider scaling provided through the optional inclusion of resistor 83 by microprocessor 48. The ability to change the scaling can also be of advantage on a single vehicle if $V_{batt}$ can vary widely over different operating conditions. An example of this situation can occur with the use of lead-acid batteries, which will typically be in the vicinity of 12 volts when the vehicle is operating but may be charged at higher voltages (e.g., 18 volts).

Figure 7:
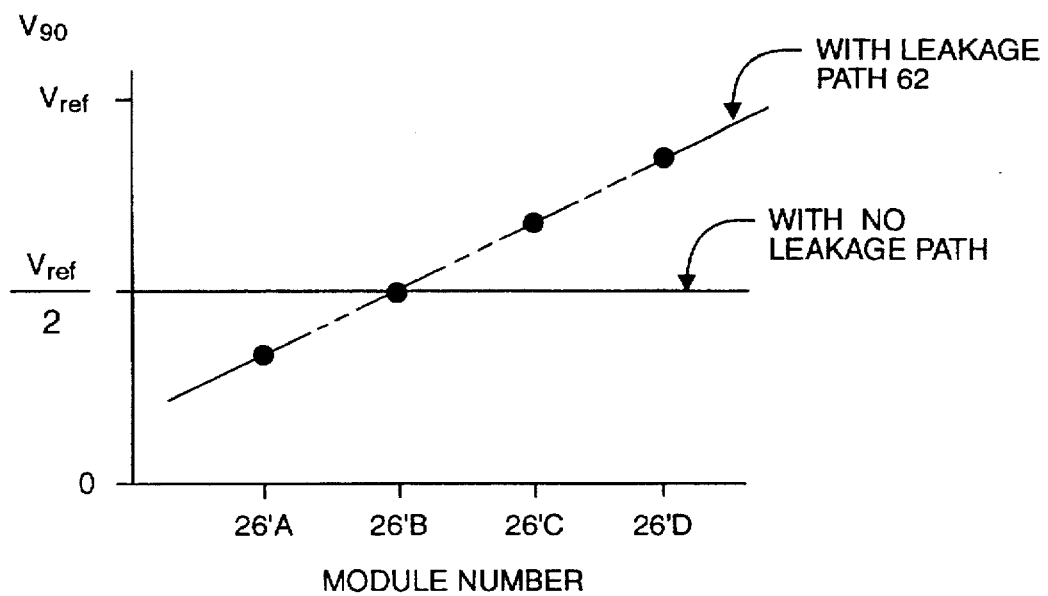
FIG. 7 is a graph showing voltage measurements taken by battery measurement modules 26' while performing a test for an electrical conductivity leakage path from batteries 20.

Battery measurement module 26' further comprises a second voltage divider comprising resistors 84 and 86. This second voltage divider is referenced to $V_{ref}$ the internal regulated voltage of module 26'. The second voltage divider is used for the conductivity leakage path detection function previously described. As before, relay 54 of each module 26' is closed, one at a time. When the relay 54 of a module 26' is closed, the voltage at node 90 of that module 261 is measured. Assuming a preferable situation in this configuration of resistors 84 and 86 being equal in resistance, the leakage detection measurements will generate results as shown in FIG. 7.

The advantage of referencing the voltage divider comprising resistors 84 and 86 to $V_{ref}$ is for consistency in taking the leakage detection measurements. It is always known that the "no-load" voltage at node 90 (i.e., the voltage with relay 54 open) is a given fraction of $V_{ref}$ (preferably one-half). It is not necessary to measure the "no-load voltage each time leakage detection is performed, nor is it necessary to be concerned about measuring the "no-load" voltage and the voltage with relay 54 closed in quick succession to be able to make a meaningful comparison of the two voltages.

By way of example only, the following resistors have been selected for use with 28 batteries of lead-acid technology each having a nominal $V_{batt}$ of 12 volts. Resistors 84 and 86 are 25 kΩ and resistor 88 Is 820 kΩ.

Various other modifications and variations Will no doubt occur to those skilled in the arts to which this invention pertains. Such variations which generally rely on the teachings through which this disclosure has advanced the art are properly considered within the scope of this invention. This disclosure should thus be considered illustrative, not limiting; the scope of the invention is instead defined by the following claims.

What is claimed is:

1. A method for detecting an electrical conductivity leakage path in a vehicle having a plurality of batteries each with a positive and negative terminal, said vehicle also having a chassis ground, each battery being isolated by design from said chassis ground, said method comprising the steps of:

(a) providing a voltage divider for each said battery, each said voltage divider having an output with a voltage at a potential between the potentials of the positive and negative terminals of the voltage divider's respective battery;

(b) providing a plurality of electrical connections, each switchable between open and closed, each between a said voltage divider output and chassis ground;

(c) closing the switchable electrical connection between a first said voltage divider output and chassis ground;

(d) measuring the voltage at said first voltage divider output with the switchable electrical connection between that voltage divider output and chassis ground closed; and (e) opening the switchable electrical connection between said first voltage divider output and chassis ground.

2. A leakage detection method as recited in claim 1, further comprising the step of repeating steps (c) through (e) for each of said voltage dividers.

3. A leakage detection method as recited in claim 1, further comprising the step of comparing said measured voltage with the output voltage of the voltage divider with the switchable electrical connection open and providing an indication of an electrical conductivity leakage path if said compared voltages differ.

4. A leakage detection method as recited in claim 1, further comprising the step of comparing said measured voltage with the output voltage of one voltage divider with the switchable electrical connection open and disconnecting said batteries from the remainder of said vehicle if said compared voltages differ.

5. A leakage detection method as recited in claim 2, further comprising the steps of:

for each voltage divider, comparing the measurement taken in step (c) with the output voltage of the corresponding voltage divider with the voltage divider's switchable electrical connection open; and if a plurality of said comparisons indicate differences, indicating the existence of an electrical conductivity leakage path.

6. A leakage detection method as recited in claim 5, further comprising the step of:

if a plurality of said comparisons indicate differences, identifying as the source of said conductivity leakage path the battery which is coupled to the voltage divider with the smallest said difference.

* * * * *